(12) United States Patent
Casey et al.

(10) Patent No.: US 6,423,174 B1
(45) Date of Patent: Jul. 23, 2002

(54) APPARATUS AND INSERTLESS METHOD FOR FORMING CAVITY SUBSTRATES USING COATED MEMBRANE

(75) Inventors: Jon A. Casey, Poughkeepsie; Govindarajan Natarajan, Pleasant Valley; Robert W. Pasco, Wappingers Falls; Vincent P. Peterson, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 894 days.

(21) Appl. No.: 08/668,291

(22) Filed: Jun. 21, 1996

(51) Int. Cl.⁷ ............................................. B32B 31/20
(52) U.S. Cl. ..................... 156/285; 156/289; 156/323; 156/382
(58) Field of Search .................. 156/89, 156, 285, 156/289, 323, 381, 382, 580, 583.1; 264/56, 58, 60, 61, 41, 313, 316

(56) References Cited

U.S. PATENT DOCUMENTS

| | | | |
|---|---|---|---|
| 4,636,275 A | 1/1987 | Norell | 156/289 |
| 4,680,075 A | 7/1987 | McNeal et al. | 156/289 |
| 4,737,208 A | 4/1988 | Bloechle et al. | 156/90 |
| 5,108,532 A | * 4/1992 | Thein et al. | 156/285 |
| 5,478,420 A | * 12/1995 | Gauci et al. | 156/89 |
| 5,520,763 A | * 5/1996 | Johnstone | 156/233 |
| 5,538,582 A | * 7/1996 | Natarajan et al. | 156/285 |

OTHER PUBLICATIONS

GC Phillips, Fixture for Fabricating Complex Substrate Design from Green Sheet Ceramics, IBM Technical Disclosure Bulletin, Apr. 1974, p. 3559.

* cited by examiner

Primary Examiner—James Sells
(74) Attorney, Agent, or Firm—Ira David Blecker

(57) ABSTRACT

The present invention relates generally to a new apparatus and method for forming cavities in semiconductor substrates without the necessity of using an insert. More particularly, the invention encompasses an apparatus and a method for fabricating cavities in semiconductor substrates wherein a coated membrane sheet is placed over the cavity prior to lamination and caused to conform to the contour of the cavity, thus preventing collapse of, or damage to, the cavity shelves during the lamination process. After the lamination process, the coated membrane is conveniently removed without causing damage to the cavity shelves or paste pull-outs.

25 Claims, 3 Drawing Sheets

APPARATUS AND INSERTLESS METHOD FOR FORMING CAVITY SUBSTRATES USING COATED MEMBRANE

FIELD OF THE INVENTION

The present invention relates generally to a new apparatus and insertless method for forming cavities in semiconductor substrates.

Semiconductor substrates and devices are becoming smaller and more dense with the evolution of new technologies. However, increases in circuit density produce a corresponding increase in overall manufacturing problems. These manufacturing problems must however be kept to a minimum in order for the semiconductor manufacturer to remain competitive. The semiconductor manufacturers are therefore constantly being challenged to improve the quality of their products by identifying and eliminating defects which produce defective parts or components. Whereas significant improvements are being made to eliminate systematic defects by reducing process variability, process improvements alone are not sufficient to eliminate all the random defects which effect both yield and reliability. Historically, screening techniques have been employed to improve product failure rates to acceptable levels by culling out many of these random defects.

In their desire to improve their products, the semiconductor manufacturers are constantly finding new ways and new techniques to improve or provide new products. It has been found that for some applications, one-could make a ceramic carrier or substrate (hereafter just substrate) having a cavity and then have the semiconductor chip placed inside the cavity and secured to the substrate. These semiconductor substrates are often referred to as modules and could be made from a single ceramic layer or green sheet forming a single layer ceramic module or a plurality of ceramic layers forming an MLC (multilayer ceramic) module.

While the remaining discussion will be directed to MLC modules, it should be understood that the teachings of the present invention can be equally applicable to single layer modules.

MLC modules having single or multiple cavities are normally used in the electronic industry to package high performance integrated circuits or chips (hereafter just chips). These high performance chips have a large number of external inputs/outputs (called I/Os), such as pads or solder balls, to name a few, and these chips have a very high power dissipation. In order to accommodate such high performance chips, the MLC module also has to provide a high number of external I/Os, such as pads, pins, solder balls, to name a few, and also be able to handle the very high power dissipation that is being generated both from the module as well as the chip. Further, there may also be wire bond pads on the shelves in the cavity.

The single or multiple cavities in an MLC substrate are normally laminated during the lamination process typically with the aid of a hard or soft insert as a plug such as that disclosed in Phillips, IBM Technical Disclosure Bulletin, April 1974, page 3559, the disclosure of which is incorporated by reference herein. This insert in turn prevents the collapse or deformation of the stacked green ceramic body during lamination. This method of producing single or multiple cavities requires machining of the inserts with high precision and with high level of surface finish.

Inherently, the cost of such inserts is very high compared to the cost of the substrate. Additionally, these inserts or plugs do not provide the flexibility of using the same inserts for cavities of various shapes and sizes. Furthermore, placing these inserts in the cavities and then subsequently removing them is an expensive process and many times removing them could lead to the delamination of the ceramic green sheets or other damage to the green ceramic body. Another drawback with these solid inserts is the need to clean them prior to every use to avoid the paste pull-outs or damage to the green ceramic layers or pads. Even with cleaning, paste pull-out often occurs due to the lack of an effective release layer.

Another method of producing these single or multiple cavities in the MLC substrate would be to machine the cavities after the green sheets have been stacked and laminated, but this would not be a cost effective way of producing parts in a high volume manufacturing operation.

It is also possible to form cavities in the MLC substrate with no inserts. This could be done for cases where the lamination conditions are such that there is no resulting deformation in the green ceramic body. In these cases, typically, the lamination pressures are very low and the green sheet formulation is such that the dimensional control of products is achieved by altering the sintering process. However, in a high volume manufacturing operation, tailoring the green sheet formulation and developing a sintering cycle for every product would be cost prohibitive and time consuming. Besides, this approach typically needs an adhesive between layers and multiple lamination steps to achieve the end result. Thus, some of the problems associated with this low pressure lamination process are that no process window for dimensional control is available for the sintered body. Delamination of the ceramic greensheets could happen in sintering due to the removal of the adhesive and the density gradients in the starting structure that are normally present could result in poor substrate dimensional control. Furthermore, there could be substantial increase in stacking and lamination cost and limitation in metal loading on the green sheets to have effective green sheet bonding.

The prior art has approached this problem in other ways as well.

McNeal et al. U.S. Pat. No. 4,680,075 and Norell U.S. Pat. No. 4,636,275, the disclosures of which are incorporated by reference herein, disclose laminating with a preformed thermoplastic or rubber plug or with a rubber bladder. A low durometer rubber (one with a durometer rating of less than Shore A 30) may be used. During the actual lamination process, no release layer or coating was disclosed although a release layer of Tedlar is suggested during the formation of the preformed plug.

Bloechle et al. U.S. Pat. No. 4,737,208, the disclosure of which is incorporated by reference herein, discloses a method of laminating a printed wiring board (non-ceramic) by utilizing a metallic template (which relieves some of the stresses on the corners of the layers), a fluropolymer (such as TFE) release layer and a conformal material (for example, butyl rubber) which fills the cavity.

In every cavity formation technique, it is essential that the material set is chosen such that a cavity profile with sharp corners and flat wire bonding shelves is achieved. When improper release and/or membrane materials are chosen, rounded edges and corners, sloped wire bond shelves and paste pullout are the result.

The present invention, however, solves these problems as described more fully in the following description taken with the accompanying drawings.

PURPOSE AND SUMMARY OF THE INVENTION

The invention is a novel apparatus and insertless method for forming cavity substrates using a coated membrane sheet.

Therefore, one purpose of the present invention is to provide an apparatus and method that will form cavities in a semiconductor substrate without the necessity of using an insert.

Another purpose of the present invention is to provide an apparatus and method that will form cavities in a semiconductor substrate without causing damage to the ceramic body or paste pull-outs.

Yet another purpose of the present invention is the providing of a coated membrane sheet which is essential to the avoiding of damage to the ceramic body and paste pull-outs.

Therefore, one aspect of the invention relates to a method of forming a ceramic substrate having at least one cavity, the method comprising the steps of:

a) placing at least one ceramic greensheet having at least one cavity over a first plate;

b) placing a planar coated membrane sheet over said cavity, wherein said membrane sheet has an elongation of greater than 350% at room temperature and a modulus of less than 1 GPa.;

c) conforming said coated membrane sheet to said cavity;

d) applying pressure to at least the coated membrane sheet and the at least one ceramic greensheet, said coated membrane sheet preventing the collapse of said cavity during this step of applying pressure.

A second aspect of the invention relates to an apparatus for forming cavities in at least one ceramic green sheet of a ceramic substrate comprising:

a.) a first plate to support said at least one greensheet, said at least one green sheet having a cavity;

b.) a planar coated membrane sheet placed over said at least one green sheet and said cavity, wherein said membrane sheet has an elongation of greater than 350% at room temperature and a modulus of less than 1 GPa.;

wherein, in operation, a pressure is applied to cause said planar coated membrane sheet to conform to the contours of the cavity and a further pressure is applied against said at least one ceramic layer, said coated membrane sheet preventing the collapse of the cavity during the application of said further pressure.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
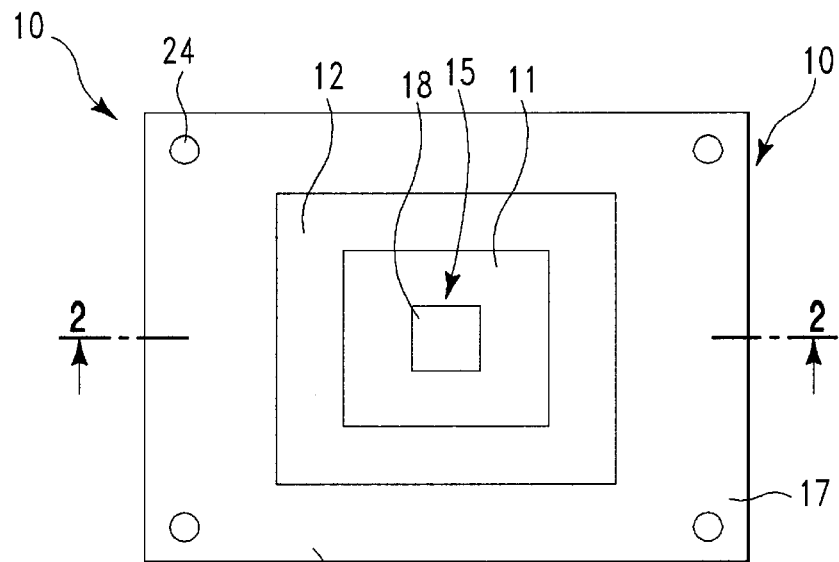
FIG. 1 is a plan view of a typical multilayer ceramic (MLC) substrate having a cavity with two shelves.

Referring to the Figures in more detail, and particularly referring to FIG. 1, there is shown a multilayer ceramic substrate 10 having a cavity 15 with shelves 11, 12. Individual ceramic green sheets are used to build the MLC substrate 10. These green sheets are typically fabricated using a tape casting process which is well known in the art. Briefly, large rolls of ceramic green sheets (i.e., unfired ceramic layers) are produced, then individual green sheets are blanked out of these large rolls of ceramic green sheets. Subsequently, individual ceramic green sheets that will form the cavity 15 are also blanked or an open area is punched appropriately to form the ceramic layers with the cavity 15.

Typically, the material for the ceramic layer is selected from a group comprising alumina, alumina with glass frits, aluminum nitride, borosilicate glass and glass ceramic, although other ceramic materials may also be used.

Wiring metallurgy, which is also well known in the art, is then applied through a standard screening process onto one or more surfaces of the individual ceramic green sheets, including those parts of the green sheets that will form shelves 11, 12. Area 18 typically is dedicated for the attachment of a semiconductor chip (not shown), while area 17 is the upper surface of the cavity substrate 10. The shelves 11, 12 typically have pads (not shown) for electrical connection (for example, by wire bonds) to the chip which is secured to the area 18.

Figure 2:
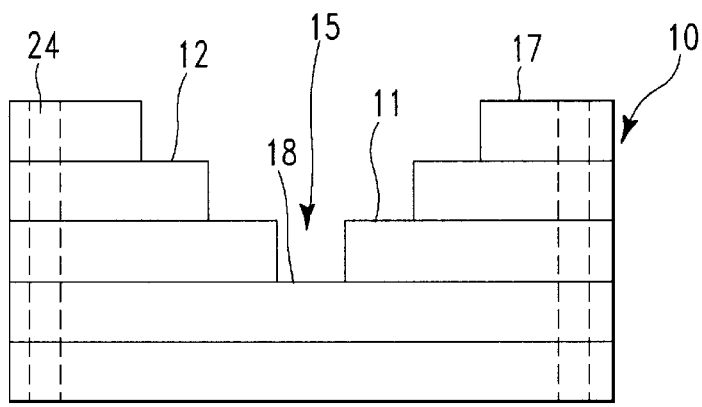
FIG. 2 is a sectional view of the MLC substrate in FIG. 1, in the direction of line II—II, showing undistorted shelves.
Figure 3:
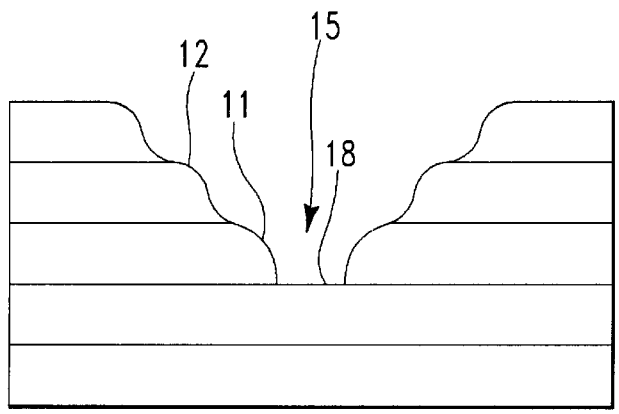
FIG. 3 is a sectional view of an MLC substrate similar to FIG. 2 but showing distorted shelves due to damage incurred during lamination according to prior art methods.

As shown in FIG. 2, the cavity substrate has sharp corners and flat shelves, which is difficult to obtain in actual practice due to damage incurred during lamination. FIG. 3 is more typical of that occurring in actual practice with rounded corners and distorted shelves.

The cavity substrate 10 shown in FIG. 2 is illustrative of that obtained by Applicants' inventive apparatus and method.

Figure 4:
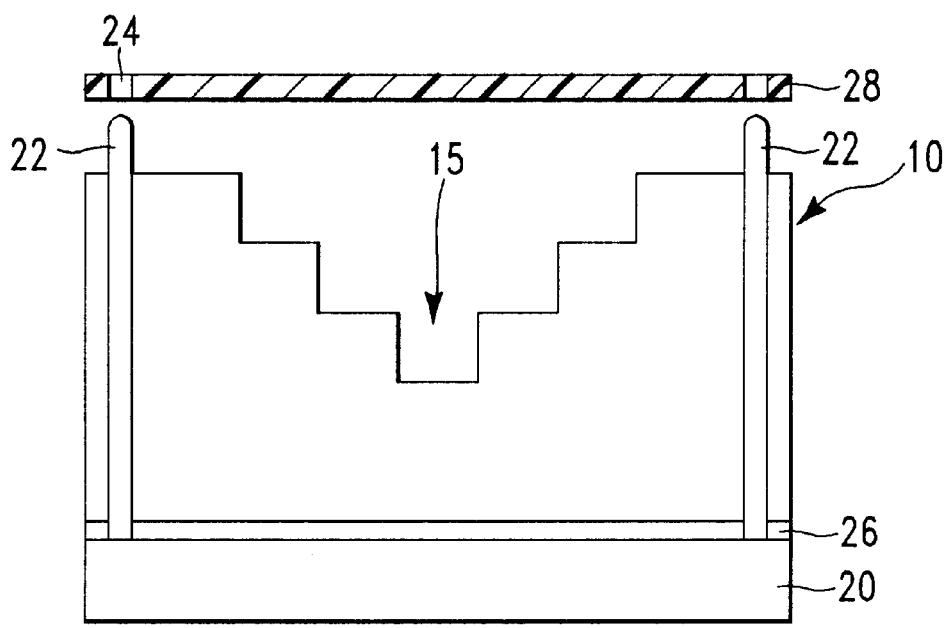
FIG. 4 is a sectional view of an MLC substrate prior to lamination with the inventive coated membrane sheet readied for positioning on the green sheet laminate.

Referring now to FIG. 4, there is shown a first plate 20, preferably a metallic plate, having at least one alignment pin 22. Each of the ceramic green sheets has at least one locating hole 24, best seen in FIG. 1, for locating the green sheets with respect to the alignment pin 22. Usually, the number of locating holes 24 on each green sheet will match the number of alignment pins 24. The green sheets are then stacked in the appropriate order on first plate 20 utilizing alignment pins 22 to form the cavity substrate 10.

Preferably, there will also be a sheet of non-sticking separator material 26 placed between the first plate 20 and the first green sheet of cavity substrate 10. The non-sticking separator material 26 is chosen so that it will not adhere to the first plate 20 or the first green sheet of the cavity substrate 10 which will ensure that under pressure, the first ceramic green sheet of cavity substrate 10 does not adhere or stick to the surface of the first plate 20. The preferred non-sticking separator material 26 is a polymeric sheet material that has minimal or no affinity for the ceramic and metallurgical materials used to build the cavity substrate 10. Some examples of non-sticky separator material are polymers such as Mylar, if rigidity and low elongation are required, or latex rubber or polyethylene if high elongation are required. Generally, the non-sticking separator material 26 should be selected from the group consisting of elastomers, Mylar, latex rubber, polyester, polyethylene, and polyurethane.

Still referring to FIG. 4, a planar, coated membrane sheet 28 is then placed on the cavity substrate 10, again using alignment pins 22 and locating holes 24 on the sheet of coated membrane material 28. As is evident from FIG. 4, the planar, coated membrane sheet 28 is flat and in no way conforms to the shape of the cavity 15. In other words, the planar, coated membrane sheet 28 is not a preformed insert. The planar, coated membrane sheet 28 will only conform to the shape of the cavity 15 when an external pressure is applied as will be described hereafter.

Figure 5:
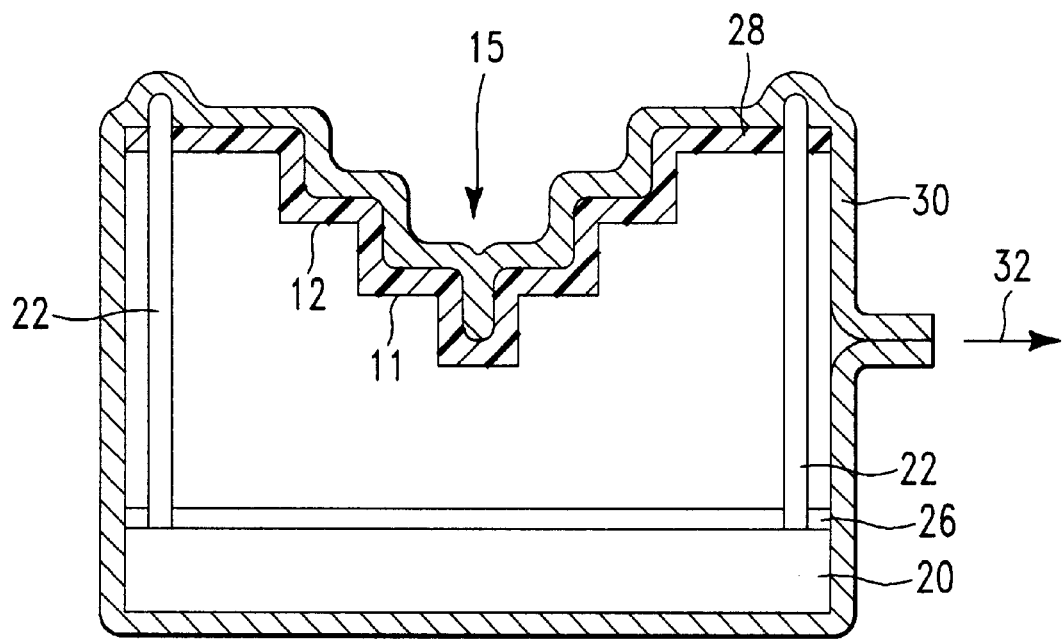
FIG. 5 is a sectional view of the MLC substrate of FIG. 4 after being placed in an enclosure and evacuated.

Referring now to FIG. 5, enclosure 30 has been placed around the assembly of first plate 20, non-sticking separator material 26, alignment pins 22, cavity substrate 10 and planar, coated membrane sheet 28 (as shown in FIG. 4) and evacuated, indicated by arrow 32, and then sealed. Both the coated membrane sheet 28 and the enclosure 30 now conform to the shape of the cavity 15. The enclosure 30 material may comprise, for example, polyurethane, thin (about 2–3 mils) Mylar, polyethylene, latex rubber, neoprene, and co-polymers of polyethylene and polypropylene. In general, the enclosure 30 should have high elongation (greater than 350%) and heat sealability.

The choice of the coated membrane sheet 28 is important to the present invention. Most preferably, it should be soft (durometer rating, where applicable, of Shore A 30 or less; durometer rating is generally used only for rubbers), be capable of elongation of greater than 350% and have a low modulus of less than 1 Gigapascals (GPa). Most preferably, the modulus should be 0.1 GPa. or less. It should also be tough and tear-resistant. These properties are important so that when the coated membrane sheet 28 is caused to conform to the shape of the cavity 15, the sharp corners of the cavity do not become rounded and the cavity shelves 11, 12 do not become distorted. Suitable materials for the coated membrane sheet 28 are silicone rubber, polyurethane, polyethylene and copolymers of polyethylene and a second polyolefin. Generally speaking, the silicone material is best for all laminating pressures, including laminating at higher pressures above about 2500 psi. The other materials have been found suitable for use up to a laminating pressure of about 2500 psi. Further, material thickness is also of importance. The maximum thicknesses for the polyurethane, polyethylene and copolymers should be about 15 mils, 4 mils and 10 mils, respectively. The present inventors have not perceived any maximum thickness for the silicone rubber material.

The present inventors have further found that it is necessary to the present invention to apply a release coating to the membrane sheet materials to avoid paste pull-outs. The best coating found is a UV (ultraviolet light) and thermally curable silicone. One such commercially available silicone coating is the UV-7000 series from Furon CHR, Worcester, Mass. The coating should be applied to a thickness of 2 mils or less. It has been found that it is necessary to apply this silicone coating to all of the preferred materials, even surprisingly the silicone rubber.

The whole assembly as shown in FIG. 5 may now be laminated. Isostatic pressure is preferred which may be applied by placing the whole assembly in a fluid such as water or a gas (e.g., air or nitrogen). Care should be taken during this lamination process that the fluid employed does not interact or degrade the enclosure 30. It may also be desired to heat the assembly to a temperature greater than the glass transition temperature of the green sheet during lamination. Strictly speaking, the enclosure 30 is not necessary if the isostatic pressure is applied by a gas but the enclosure 30 is desirable to cause the coated membrane sheet 24 to conform to the shape of the cavity 15 through evacuation of the enclosure 30.

Figure 6:
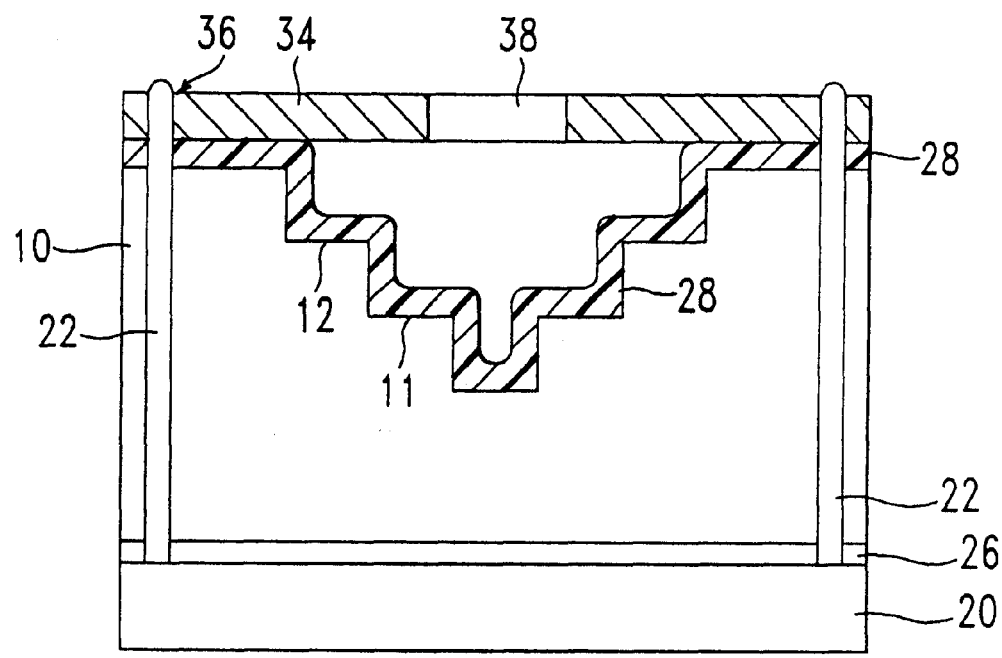
FIG. 6 is a sectional view of another MLC substrate during lamination with the coated membrane sheet conformed to the cavity.

Referring now to FIG. 6, there is shown a further embodiment of the present invention. The embodiment of FIG. 6 is similar to the embodiment of FIG. 5, except that in FIG. 6 there is no enclosure 30. In addition, the apparatus in FIG. 6 further includes a second plate 34 having apertures 36 for alignment with alignment pins 22 and a central aperture 38. In operation, uniaxial pressure would be applied by a ram (not shown) against second plate 34 to cause lamination of the cavity substrate 10. A fluid, preferably a gas, would be applied through aperture 38 of second plate 34 to cause the coated membrane sheet 28 to conform to the shape of the cavity 15 and to protect the cavity during lamination. The apparatus is usually also heated to a temperature greater than the glass transition temperature of the green sheet during lamination to facilitate the lamination process. After lamination, the second plate 34 and coated membrane 28 are removed followed by removal of the cavity substrate 10 from first plate 20.

Figure 7:
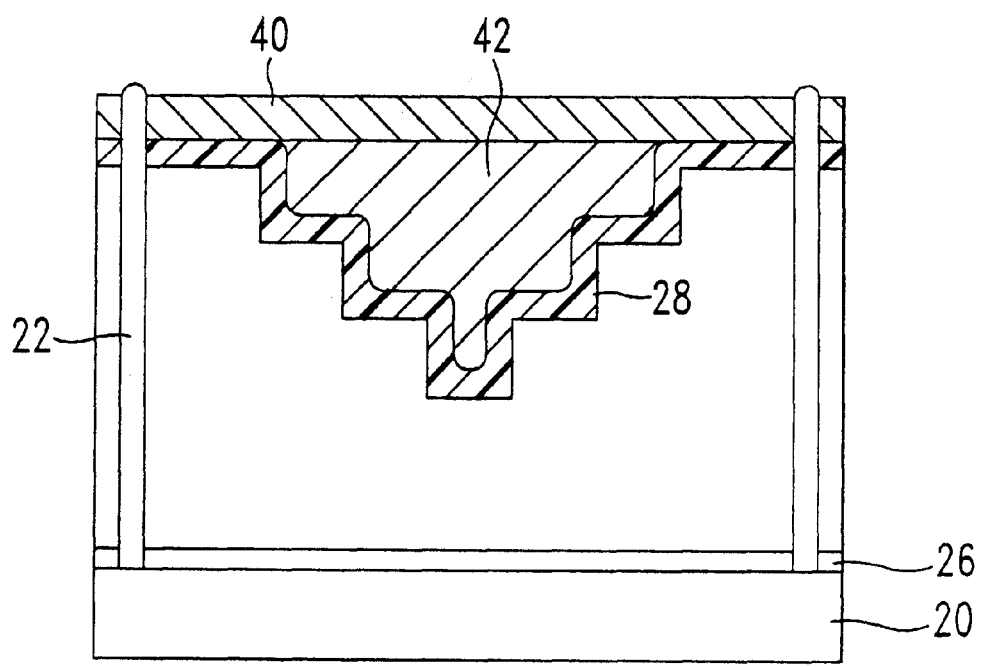
FIG. 7 is a sectional view of another MLC substrate during lamination with the coated membrane sheet conformed to the cavity and with an insert in the cavity.

A last embodiment of the invention is illustrated in FIG. 7. The FIG. 7 embodiment of the present invention is similar to that shown in FIG. 6 except that the second plate 40 does not have an aperture for application of a gas and there is an insert 42. In operation, insert 42 would be pressed into the cavity 15 by second plate 40 causing the coated membrane sheet 28 to conform to the shape of the cavity 15. Further application of pressure against second plate 40, such as by a ram (not shown), would cause lamination of the cavity substrate 10. Again, the apparatus is usually also heated to a temperature greater than the glass transition temperature of the green sheet during lamination to facilitate the lamination process. After lamination, the second plate 40 and coated membrane 28 are removed followed by removal of the cavity substrate 10 from first plate 20.

The purposes and advantages of the present invention are further illustrated by referring to the following examples which are intended only to further illustrate the invention and are not intended to limit the scope of the present invention in any manner.

EXAMPLES

Example 1

Several samples of multilayer ceramic bodies containing cavities were fabricated using the process of this invention. In one sample a stack of cavity-containing metallized ceramic layers were placed in a lamination frame, and the ceramic layers were separated from the bottom lamination plate by a layer of Mylar, and the second plate by a silicone coated silicone rubber/membrane. The 12 mil thick 30 durometer (shore A) coated silicone membrane had an elongation of about 900 percent and a modulus of about 0.01 GPa. The silicone film was 9235 silicone film and coated with a UV-7000 series silicone coating of about 3 microns in thickness, both from Furon CHR, Worcester, Mass. This assembly was then put in a 3 mil thick polyurethane bag (30 durometer shore A), evacuated and heat sealed. The polyurethane was obtained from Stevens Urethane Film & Sheet, Northampton, Mass. The bag with the contents was laminated under pressure to 6000 psi and temperature to about 90 degrees C in an isostatic press. After the lamination the cavity substrate was then removed from the bag and inspected. It was found that the cavity and the ceramic body had good dimensional control. More significantly, due to the silicone coating and the nature of the base coated surface, there was no paste-pull under these severe lamination conditions.

Example 2

In this Example, an assembly of ceramic layers were stacked and laminated in a manner similar to that described in Example 1 except that a non-coated silicone sheet was used. This sample produced good dimensional control for both the cavity and the ceramic body. There was no ceramic pull-out observed but there was random paste pull-out observed. The paste pull-out phenomena was consistent in repetitive samples.

Example 3

In this example, an assembly of ceramic layers were stacked and laminated in a manner described in Example 1, but the coated silicone membrane layer was not used. This sample produced good dimensional control for both cavity and ceramic body but very severe paste and ceramic pull by the bag material and the lamination plate was observed, thus demonstrating the need for the coated membrane and process of this invention.

Example 4

In this example, other types of coated membranes were used. An assembly of metallized ceramic layers containing a multistep cavity design and the individual ceramic layers were stacked and placed in the lamination frame. The coated membrane tried was made of copolymers of polyethylene and polypropylene (3 mils thick plus 2 micron thick silicone coating; modulus of 0.33 GPa.; film obtained from Custom Coating & Laminating Corp., Worcester, Mass.) for some samples, polyurethane (3 mils thick plus 5 micron thick silicone coating; modulus of 0.03 GPa.; film obtained from JPS Elastomerics Corp., Northampton, Mass.) for some samples and polypropylene (3 mils thick plus 2 micron thick silicone coating; modulus of 2.25 GPa.; film obtained from Custom Coating & Laminating Corp., Worcester, Mass.) on other samples. In all cases the coating used was the UV-7000 series silicone coating. The rest of the assembly and the procedure followed was as explained in example 1. After the cavity substrate had been laminated, the cavity substrate was inspected. It was found that the laminated structure and the multi-step cavity dimensions were within the desired specifications for silicone coated polyurethane membrane with polyurethane bag for all pressures up to 5500 psi. With the other coated membrane materials, the required dimensions could be met only up to 2000 psi. There was no paste pull-outs in all cases. Polypropylene was found to be not a good material for cavity formation because of its high modulus.

Example 5

In this Example, the membranes used were similar to those used in Example 4 but with no silicone coating. In all cases (whether the copolymer of polyethylene and polypropylene, polyurethane or polypropylene), the cavity profile results were similar as in Example 4, but the paste pull-out was extremely bad, leading to rejectable samples.

Example 6

In this example, an assembly of ceramic layers were stacked and laminated in a manner described in example 1, but a metal insert was used in the cavity between the silicone-coated silicone membrane and the top lamination plate. The lamination pressure applied is from an hydraulic press. Lamination occurred at a pressure of 4500 psi and a temperature of 85 degrees Centigrade. After the cavity substrate had been laminated, the cavity was inspected. It was found that the cavity structure and dimensions were within the desired specification. There were no paste pull-outs.

The surface finish and the cleanliness of the insert used was purposely made sub-standard compared to when no membrane is used. Since the insert surface does not touch the cavity, more economical inserts could be used. Further, the quality of the product is not dependent on the quality of the insert due to the inventive coated membrane process of the present invention.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a ceramic substrate having at least one cavity, the method comprising the steps of:
    a) placing at least one ceramic greensheet having at least one cavity over a first plate;
    b) placing a planar coated membrane sheet over said cavity, wherein said coated membrane sheet has an elongation of greater than 350% at room temperature and a modulus of less than 1 Gpa. and wherein said coated membrane sheet is selected from the group consisting of silicone-coated silicone rubber, silicone-coated polyurethane, silicone-coated polyethylene and silicone-coated copolymers of polyethylene and a second polyolefin;
    c) conforming said coated membrane sheet to said cavity;
    d) applying pressure to at least the coated membrane sheet and the at least one ceramic greensheet, said coated membrane sheet preventing the collapse of said cavity during this step of applying pressure.

2. The method of claim 1 wherein said membrane sheet has a modulus of 0.1 GPa. or less.

3. The method of claim 1 wherein said membrane sheet has a durometer rating of about 30 or less.

4. The method of claim 1 wherein there are at least two ceramic greensheets and wherein the step of applying pressure causes said two ceramic green sheets to become laminated.

5. The method of claim 1 wherein the pressure applied is about 2500 psi or less.

6. The method of claim 1 wherein the pressure applied is about 2500 psi or more.

7. The method of claim 1 wherein the step of applying pressure is selected from the group consisting of isostatic pressure, hydrodynamic pressure and hydraulic pressure.

8. The method of claim 1 wherein said first plate, said at least one ceramic green sheet and said coated membrane sheet are inside at least one environmental enclosure.

9. The method of claim 8 further comprising the step, prior to applying pressure, of evacuating said environmental enclosure wherein said environmental enclosure collapses and follows the contour of said at least one ceramic greensheet and said first plate.

10. The method of claim 1 further comprising the step, prior to applying pressure, of placing a second plate over said coated membrane sheet and said at least one ceramic green sheet, wherein in the step of applying pressure said first plate and said second plate move closer to one another.

11. The method of claim 1 further comprising the steps, prior to applying pressure, of placing a preformed insert in said cavity and placing a second plate over said coated membrane sheet, said preformed insert and said at least one ceramic green sheet, wherein in the step of applying pressure said first plate and said second plate move closer to one another.

12. The method of claim 1 further comprising the step, after the step of applying pressure, of removing the coated membrane from the at least one ceramic green sheet.

13. An apparatus for forming cavities in at least one ceramic green sheet of a ceramic substrate comprising:
   a.) a first plate to support said at least one greensheet, said at least one green sheet having a cavity;
   b.) a planar coated membrane sheet placed over said at least one green sheet and said cavity, wherein said membrane sheet has an elongation of greater than 350% at room temperature and a modulus of less than 1 Gpa. and wherein said coated membrane sheet is selected from the group consisting of silicone-coated silicone rubber, silicone-coated polyurethane silicone-coated polyethylene and silicone-coated copolymers of polyethylene and a second polyolefin;
      wherein, in operation, a pressure is applied to cause said planar coated membrane sheet to conform to the contours of the cavity and a further pressure is applied against said at least one ceramic layer, said coated membrane sheet preventing the collapse of the cavity during the application of said further pressure.

14. The apparatus of claim 13 wherein said membrane sheet has a modulus of 0.1 GPa. or less.

15. The apparatus of claim 13 wherein said membrane sheet has a durometer rating of about 30 or less.

16. The apparatus of claim 13 wherein there are at least two ceramic green sheets and wherein the application of the further pressure causes said two ceramic greensheets to become laminated.

17. The apparatus of claim 13 wherein the pressure applied is about 2500 psi or less.

18. The apparatus of claim 13 wherein the pressure applied is about 2500 psi or more.

19. The apparatus of claim 13 wherein the pressure is applied by isostatic pressure, hydrodynamic pressure or hydraulic pressure.

20. The apparatus of claim 13 further comprising at least one environmental enclosure wherein said first plate, said at least one ceramic green sheet and said coated membrane sheet are inside said at least one environmental enclosure.

21. The apparatus of claim 20 wherein, in operation and prior to the application of pressure, said environmental enclosure is evacuated so that said environmental enclosure collapses and follows the contour of said at least one ceramic green sheet and said first plate.

22. The apparatus of claim 13 further comprising a second plate placed over said coated membrane sheet and said at least one ceramic green sheet so that when pressure is applied, said first plate and said second plate move closer to one another.

23. The apparatus of claim 13 further comprising a preformed insert placed in said cavity and a second plate placed over said coated membrane sheet, said preformed insert and said at least one ceramic green sheet so that when pressure is applied, said first plate and said second plate move closer to one another.

24. The method of claim 1 wherein the silicone utilized to coat the membrane sheet is an ultraviolet light and thermally curable silicone.

25. The apparatus of claim 13 wherein the silicone utilized to coat the membrane sheet is an ultraviolet light and thermally curable silicon.

* * * * *